(12) United States Patent
Kang

(10) Patent No.: US 9,502,095 B1
(45) Date of Patent: Nov. 22, 2016

(54) MEMORY SYSTEM

(71) Applicant: SK hynix Inc., Icheon-si Gyeonggi-do (KR)

(72) Inventor: Hyuk Choong Kang, Seongnam-si Gyeonggi-do (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/876,920

(22) Filed: Oct. 7, 2015

(30) Foreign Application Priority Data

Jun. 12, 2015 (KR) .................. 10-2015-0083633

(51) Int. Cl.
*G11C 16/10* (2006.01)
*G11C 11/406* (2006.01)
*G11C 14/00* (2006.01)
*G11C 11/4076* (2006.01)
*G11C 11/4074* (2006.01)

(52) U.S. Cl.
CPC .......... *G11C 11/406* (2013.01); *G11C 11/4074* (2013.01); *G11C 11/4076* (2013.01); *G11C 14/0009* (2013.01); *G11C 16/10* (2013.01)

(58) Field of Classification Search
CPC .............................. G11C 16/10; G11C 16/26
USPC ........................................ 365/185.08, 185.24
See application file for complete search history.

(56) References Cited

U.S. PATENT DOCUMENTS

| 2002/0191467 | A1 | 12/2002 | Matsumoto et al. |
| 2005/0094631 | A1 | 5/2005 | Park et al. |
| 2009/0204835 | A1* | 8/2009 | Smith .................. G06F 1/3203 713/323 |
| 2010/0250989 | A1* | 9/2010 | Hamilton ............. G06F 1/3203 713/323 |
| 2014/0269123 | A1 | 9/2014 | Kim et al. |

FOREIGN PATENT DOCUMENTS

| KR | 1020030009125 A | 1/2003 |
| KR | 1020050041701 A | 5/2005 |
| KR | 1020140113191 A | 9/2014 |

* cited by examiner

*Primary Examiner* — Michael Tran
(74) *Attorney, Agent, or Firm* — William Park & Associates Ltd.

(57) ABSTRACT

A memory system is disclosed, which relates to a technology for reducing current consumption needed to perform a refresh operation in a Dual In-line Memory Module. The memory system includes a memory module, which includes a volatile memory and a non-volatile memory, and a host configured to provide a refresh command to the memory module during the refresh operation. The memory module is configured to store cell characteristic information of the volatile memory in the non-volatile memory in an idle state, and control a refresh operation of the volatile memory in response to the cell characteristic information.

18 Claims, 2 Drawing Sheets

MEMORY SYSTEM

CROSS-REFERENCE TO RELATED APPLICATION

This application claims priority under 35 U.S.C. §119(a) based upon Korean patent application No. 10-2015-0083633 filed on Jun. 12, 2015, in the Korean Intellectual Property Office, the disclosure of which is hereby incorporated by reference in its entirety.

BACKGROUND OF THE INVENTION

Embodiments of the present disclosure generally relate to a memory system, and more particularly to a technology for reducing current consumption needed to perform a refresh operation in a Dual In-line Memory Module.

A memory cell of a dynamic semiconductor memory such as a dynamic random access memory (hereinafter referred to as "DRAM") stores data in a capacitive element. Due to leakage of charges from the capacitive element, the memory cell must be periodically refreshed. A refresh process may include the process of reading data from a certain memory cell and rewriting the read data to the same memory cell.

There are various types of refresh methods that have been used in the dynamic semiconductor memory. Auto refresh is a refresh method that performs refresh operations in response to a periodic refresh command provided from a controller. The semiconductor memory may perform auto refresh operations according to a refresh timer located outside the semiconductor memory.

Self refresh is a refresh method that uses an internal refresh timer located inside the memory chip. According to an example, the semiconductor memory may request a refresh start command from the controller.

Typically, it is impossible for a memory cell to be accessed for the normal read and write operations while the memory cell is being refreshed. A refresh operation lasts for a time referred to as the refresh cycle time ("tRFC"), and then an active cycle may start an operation.

Memory cells may have different data retention times. Therefore, if the same refresh operation is performed on all the memory cells, unnecessary current consumption may occur.

Lower power consumption is the dominant requirement in designing a mobile product, and thus it is very important to reduce current consumption caused by the refresh operation.

BRIEF SUMMARY OF THE INVENTION

Various embodiments of the present disclosure are directed to providing a memory system for reducing current consumption needed to perform a refresh operation, thereby reducing current consumption.

The embodiments of the present disclosure relate to a technology for storing cell characteristic information in a non-volatile memory of a Dual In-line Memory Module (hereinafter referred to as "DIMM"), which includes a volatile memory and the non-volatile memory, such that the refresh operation can be controlled in response to the stored cell characteristic information.

In accordance with an embodiment of the present disclosure, a memory system includes: a memory module including a volatile memory and a non-volatile memory, configured to store cell characteristic information of the volatile memory in the non-volatile memory in an idle state, control a refresh operation of the volatile memory in response to the cell characteristic information during a refresh operation; and a host configured to provide a refresh command to the memory module during the refresh operation.

In accordance with another embodiment of the present disclosure, a memory system includes: a volatile memory configured to store data as volatile data; a non-volatile memory configured to store the data as non-volatile data; and a memory controller configured to store cell characteristic information of the volatile memory in the non-volatile memory in an idle state, and control a refresh operation of the volatile memory in response to the cell characteristic information during a refresh operation.

It is to be understood that both the foregoing general description and the following detailed description of the present disclosure are exemplary and explanatory and are intended to provide further explanation of the invention as claimed.

BRIEF DESCRIPTION OF THE DRAWINGS

The above and other features and advantages of the present disclosure will become readily apparent by reference to the following detailed description when considered in conjunction with the accompanying drawings wherein.

DESCRIPTION OF EMBODIMENTS

Reference will now be made in detail to embodiments of the present disclosure, examples of which are illustrated in the accompanying drawings. Wherever possible, the same reference numbers are used throughout the drawings to refer to the same or like portions. In the following description of the present disclosure, a detailed description of related known configurations or functions incorporated herein may be omitted for clarity of the subject matter of the present disclosure.

Figure 1:
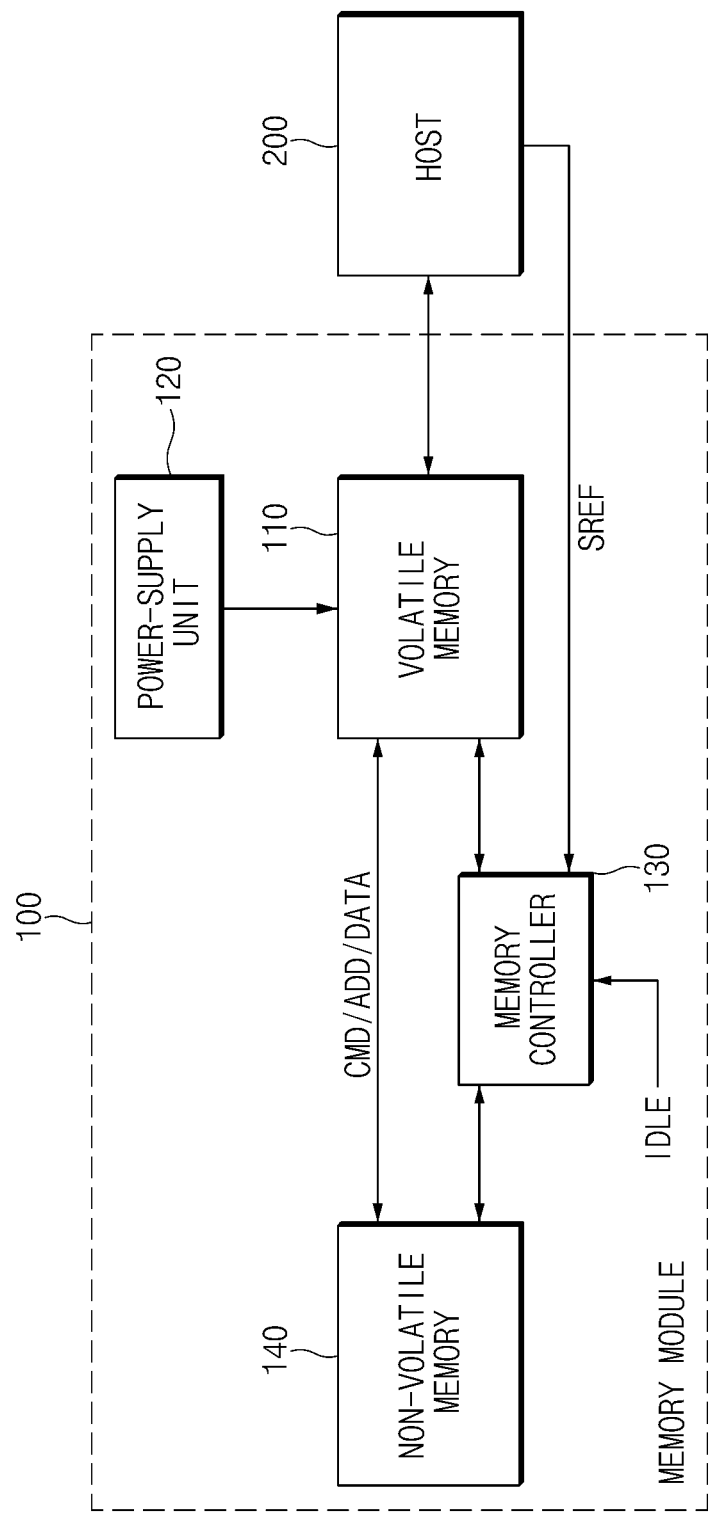
FIG. 1 is a block diagram illustrating a memory system according to an embodiment of the present disclosure.

FIG. 1 is a block diagram illustrating a memory system according to an embodiment of the present disclosure.

Referring to FIG. 1, the memory system according to an embodiment may include a memory module 100 and a host 200. The memory module 100 may include a volatile memory 110, a power-supply unit 120, a memory controller 130, and a non-volatile memory 140.

The memory module 100 may include different types of memories. The memory module 100 may be implemented as a Non Volatile Dual In-line Memory Module (hereinafter referred to as "NVDIMM").

The memory module 100 may include a volatile memory 110 that requires power to retain stored data, and a non-volatile memory 140 that can retain stored data even in absence of power supply.

The volatile memory 110 may include a dynamic random access memory (hereinafter referred to as "DRAM"), and the non-volatile memory 140 may include a flash memory.

However, the scope or spirit of the present disclosure is not limited thereto, the volatile memory may include a Static Random Access Memory ("SRAM"), a Double Data Rate Synchronous DRAM ("DDR SDRAM"), a Low Power DDR SDRAM, a Graphics DDR SDRAM, or a Rambus DRAM.

The non-volatile memory may include a Mask Read-Only Memory ("MROM"), a Programmable Read-Only Memory ("PROM"), an Erasable Programmable Read-Only Memory ("EPROM"), an Electrically Erasable Programmable Read-Only Memory ("EEPROM"), a Phase Change Random Access Memory ("PRAM"), a Resistive Random Access Memory ("RRAM"), or a Magnetic Random Access Memory ("MRAM").

The non-volatile memory may include one or more of a NAND-type flash memory and a NOR-type flash memory.

A bus may be shared between the volatile memory 110 and the non-volatile memory 140, such that a command signal CMD, an address ADD, and data DATA may be exchanged between the volatile memory 110 and the non-volatile memory 140. The volatile memory 110 and the non-volatile memory 140 may be coupled to the memory controller 130 such that the operations of the volatile memory 110 and the non-volatile memory 140 can be controlled by the memory controller 130.

When the power is off in the middle of the operation of the memory module 100, the power-supply unit 120 may provide a temporary power-supply voltage to the volatile memory 110 in a standby mode of the volatile memory 110. For example, the power-supply unit 120 may provide a power-supply voltage to the volatile memory 110 during the operation period in which the memory controller 130 reads information regarding cell characteristics of the volatile memory 110 and stores the information in the non-volatile memory 140.

The host 200 may control various operations carried out by the non-volatile memory 110. For example, the host 200 may generate control signals to perform the write operation or the read operation of the volatile memory 110. The host 200 may output a refresh command SREF and other control signals to the memory controller 130.

Highly integrated semiconductor memories have a huge number of memory cells. As the number of memory cells increases, power consumption for the refresh power-supply also increases. For example, a data center or a super computer, which have a lot of highly integrated semiconductor memory devices, may encounter more serious problems.

The cell data retention time may vary according to cell characteristics. However, the same refresh operation is applied uniformly across all the memory cells no matter whether the memory cell is a normal cell or a weak cell. For example, even if the normal cell having superior refresh characteristics need not be refreshed, the refresh operation may be performed, thereby causing unnecessary current consumption.

Accordingly, the memory controller 130 according to an embodiment of the present disclosure may read, in an idle state, cell characteristic information of the volatile memory 110, and then store the information in the non-volatile memory 140.

Here, the idle state may include a state in which a temporary power-supply voltage is supplied from the power-supply unit 120 to the memory module 100 when the power is off while the memory module 100 is not activated.

Therefore, cell characteristic information of the volatile memory 110 according to an embodiment of the present disclosure may be stored in the non-volatile memory 140. During the refresh operation, the memory controller 130 may read cell characteristic information stored in the non-volatile memory 140, and perform the refresh operation according to the cell characteristic information.

For example, during the refresh operation, the memory controller 130 may, by referring to information stored in the non-volatile memory 140, determine whether or not the refresh operation needed for the volatile memory 110, and which refresh operation will be performed. In a case where the refresh operation is needed for the volatile memory 110, the memory controller 130 may determine a refresh operation period of the volatile memory 110 by referring to information stored in the non-volatile memory 140.

If a normal cell having superior refresh characteristics is selected from the volatile memory 110, the refresh operation may be omitted, or the refresh time may be reduced as compared to the conventional refresh time by performing the self refresh operation. That is, if the refresh operation is no longer required, the refresh operation may be omitted to reduce power consumption. If a weak cell is selected from the volatile memory 110, the self refresh operation may be normally performed, or the refresh time may be increased.

The memory controller 130 according to an embodiment of the present disclosure may include a memory buffer or a register clock driver ("RCD").

The NVDIMM module may include a non-volatile memory 140 and a volatile memory 110.

The NVDIMM may read data of the volatile memory 110 and store the read data in the non-volatile memory 140 such that data of the volatile memory 110 can be retained while the power is off. When the power is restored, the NVDIMM starts to perform its operations, and data stored in the non-volatile memory 140 is recovered in the volatile memory 110.

The non-volatile memory 140 is rarely used during the normal operation of the volatile memory 110, thereby deteriorating resource efficiency.

The memory controller 130 according to an embodiment of the present disclosure may store, in an idle state of the memory module 100, cell characteristic information, which indicates a cell data retention time of the volatile memory 110, in the non-volatile memory 140. During the refresh operation, the memory controller 130 may read cell characteristic information stored in the non-volatile memory 140, and may control the refresh operation of the volatile memory 110, thereby increasing the resource efficiency.

Figure 2:
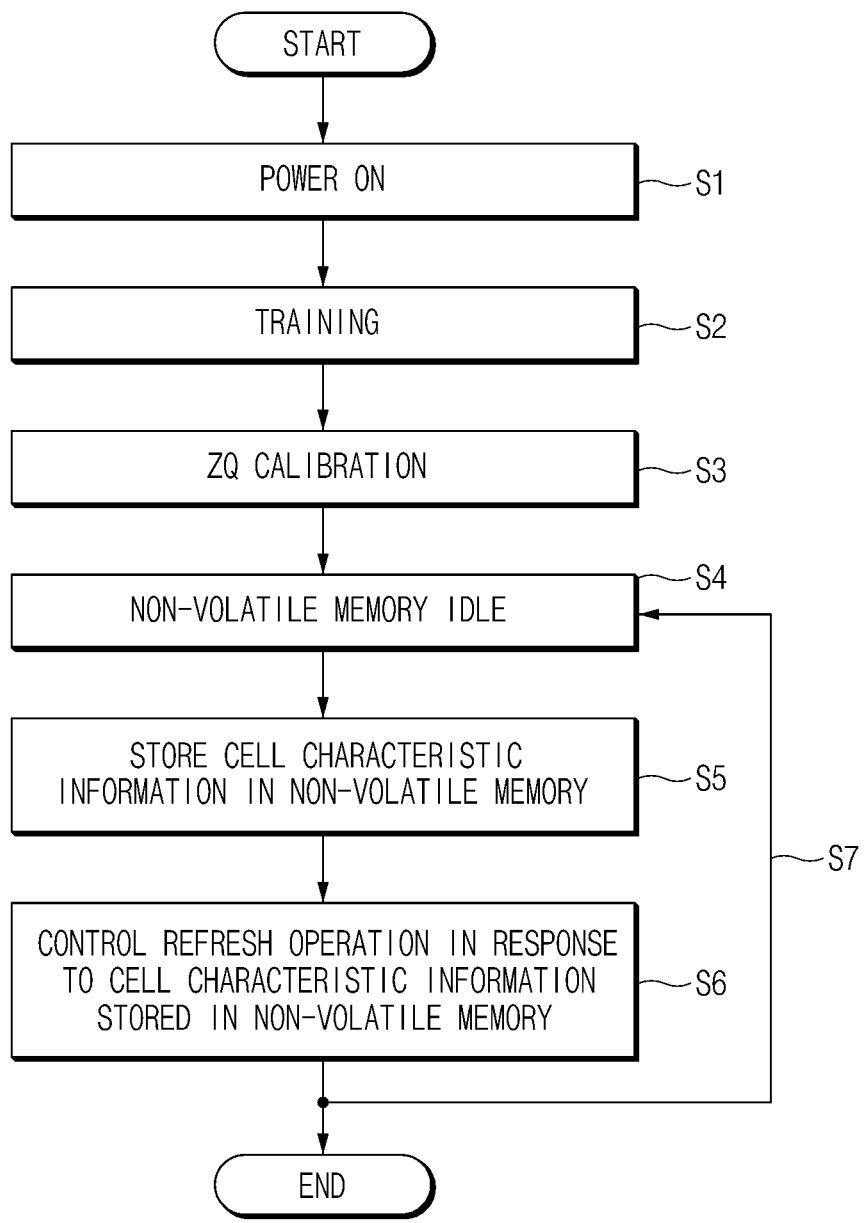
FIG. 2 is a flowchart illustrating operations of the memory system shown in FIG. 1.

FIG. 2 is a flowchart illustrating operations of the memory system shown in FIG. 1.

Referring to FIG. 2, after completing a power-on sequence of the volatile memory 110 of the memory module 100, the volatile memory 110 may enter a stabilization step. Thereafter, during a boot-up operation, the volatile memory 110 may scan a fuse array (e.g., E-fuse) and perform a data training operation in step S2. A ZQ calibration operation for adjusting impedance of an output terminal of the volatile memory 110 is performed in step S3.

The above-mentioned embodiment has disclosed that the ZQ calibration operation is performed after the completion of the data training operation. However, the scope or spirit of the present disclosure is not limited thereto, and thus various calibration operations other than the ZQ calibration operation may be carried out as necessary.

Thereafter, if the volatile memory 110 enters an idle state, the memory controller 130 may detect the idle state of the volatile memory 110 in step S4. The memory controller 130 may read cell characteristic information of the volatile memory 110, and store the information in the non-volatile memory 140 in step S5.

The above-mentioned embodiment has exemplarily disclosed that the volatile memory 110 stores cell characteristic information in the non-volatile memory 140 when entering the idle state for convenience of description and better understanding of the present disclosure. However, the scope or spirit of the present disclosure is not limited thereto. If the ZQ calibration operation is completed in the initial stage of the memory module 100, cell characteristic information of the volatile memory 110 may be read before entering the idle state to be stored in the non-volatile memory 140.

Subsequently, the host 200 may activate the refresh command SREF for self-refreshing the volatile memory 110, and then output the activated refresh command SREF to the memory controller 130. During activation of the refresh command SREF, the memory controller 130 may, by referring to cell characteristic information stored in the non-volatile memory 140 in step S6, determine whether or not the refresh operation is needed for the volatile memory 110, and which refresh operation will be performed.

For example, if the refresh command SREF for power saving is generated from the host 200 and then activated, the memory controller 130 may receive the activated refresh command SREF to read information stored in the non-volatile memory 140. That is, after the completion of the power-up sequence or after the completion of the power down mode, the refresh operation may be initiated by the refresh command SREF.

Therefore, if a normal cell of the volatile memory 110 is subject to a refresh operation, the memory controller 130 may determine whether or not the refresh operation is needed, and then may omit the refresh operation or may reduce the refresh time, thereby reducing power consumption. If a weak cell of the volatile memory 110 is subject to a refresh operation, the memory controller 130 may increase the self refresh time.

The memory controller 130 may detect the next idle state after the normal operation of the volatile memory 110. As a result, a feedback operation is performed in step S7, cell characteristic information of the volatile memory 110 may be read again to be updated and stored again in the non-volatile memory 140.

As described above, the above-mentioned embodiment can be applied to NVDIMM for convenience of description and better understanding of the present disclosure. However, the scope or spirit of the present disclosure is not limited thereto, and the above-mentioned embodiment can also be applied to all memory systems for storing volatile cell information using non-volatile memories, for example, hybrid DIMM, typical DIMM, non-volatile memory devices, etc.

The memory module 100 according to an embodiment may include an Unbuffered Dual In-line Memory Module ("UDIMM"), a Registered Dual In-line Memory Module ("RDIMM"), a Fully Buffered Dual In-line Memory Module ("FBDIMM"), a Load Reduced Dual In-line Memory Module ("LRDIMM") or other memory modules.

In an embodiment of the present disclosure, the memory system may reduce current consumption caused by the refresh operation in a DIMM.

Those skilled in the art will appreciate that the invention may be carried out in other specific ways than those set forth herein without departing from the spirit and essential characteristics of the invention. The above embodiments are therefore to be construed in all aspects as illustrative and not restrictive. The scope of the invention should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment of the invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A memory system comprising:
    a memory module including a volatile memory and a non-volatile memory, the memory module being configured to store cell characteristic information of the volatile memory in the non-volatile memory in an idle state, and control a refresh operation of the volatile memory in response to the cell characteristic information;
    a host configured to provide a refresh command to the memory module during the refresh operation; and
    a power-supply unit configured to provide a power-supply voltage to the volatile memory when a power is off in the middle of an operation of the memory module.

2. The memory system according to claim 1, wherein the power-supply unit provides a power-supply voltage to the volatile memory during a predetermined time period in which the cell characteristic information of the volatile memory is stored in the non-volatile memory.

3. The memory system according to claim 1, wherein the volatile memory includes a dynamic random access memory.

4. The memory system according to claim 1, wherein the non-volatile memory includes a flash memory.

5. The memory system according to claim 1, wherein the volatile memory and the non-volatile memory are configured to exchange at least one of a command signal, an address, and data with each other.

6. The memory system according to claim 1, wherein the memory module includes:
    a memory controller configured to store, when detecting the idle state, the cell characteristic information of the volatile in the non-volatile memory, read the cell characteristic information when the refresh command is activated, and control a refresh operation of the volatile memory.

7. The memory system according to claim 6, wherein the memory controller includes one or more of a memory buffer and a register clock driver.

8. The memory system according to claim 1, wherein the cell characteristic information includes a cell data retention time of the volatile memory.

9. The memory system according to claim 1, wherein the memory module reads the cell characteristic information stored in the non-volatile memory, and controls a refresh operation period of the volatile memory using the read cell characteristic information.

10. The memory system according to claim 1, wherein, if a normal cell is selected from the volatile memory, the memory module omits the refresh operation, or reduces a refresh time as compared to a predetermined refresh time such that the refresh operation is performed during the reduced refresh time.

11. The memory system according to claim 1, wherein, if a weak cell is selected from the volatile memory, the memory module normally performs the refresh operation or increases a refresh time.

12. The memory system according to claim 1, wherein:
if a boot-up operation of the volatile memory, a data training operation, and a ZQ calibration operation are performed during a power-on sequence of the volatile memory, the memory module reads the cell characteristic information, and stores the read cell characteristic information in the non-volatile memory.

13. A memory system comprising:
a volatile memory;
a non-volatile memory; and
a memory controller configured to store cell characteristic information of the volatile memory in the non-volatile memory in an idle state, and control a refresh operation of the volatile memory in response to the cell characteristic information during a refresh operation,
wherein the cell characteristic information includes a cell data retention time of the volatile memory.

14. The memory system according to claim 13, wherein the volatile memory includes a dynamic random access memory, and the non-volatile memory includes a flash memory.

15. The memory system according to claim 13, wherein the memory controller detects a subsequent idle state after completing a normal operation of the volatile memory, reads the cell characteristic information of the volatile memory, and enables the read cell characteristic information to be updated to the non-volatile memory.

16. The memory system according to claim 13, wherein the memory controller reads the cell characteristic information stored in the non-volatile memory, and controls a refresh operation period of the volatile memory using the read cell characteristic information.

17. The memory system according to claim 13, wherein, if a normal cell is selected from the volatile memory, the memory module omits the refresh operation, or reduces a refresh time as compared to a predetermined refresh time such that the refresh operation is performed during the reduced refresh time.

18. The memory system according to claim 13, wherein, if a weak cell is selected from the volatile memory, the memory module normally performs the refresh operation or increases a refresh time.

* * * * *